United States Patent [19]

Someshwar

[11] 4,190,897
[45] Feb. 26, 1980

[54] BINARY CODED DECIMAL ADDRESSED READ-ONLY-MEMORY

[75] Inventor: Ashok H. Someshwar, Richardson, Tex.

[73] Assignee: Texas Instruments Incorporated, Dallas, Tex.

[21] Appl. No.: 783,516

[22] Filed: Apr. 1, 1977

[51] Int. Cl.[2] .................. G11C 8/00; G11C 17/00
[52] U.S. Cl. .................................. 364/900; 365/230
[58] Field of Search ............ 364/200, 900 MS File; 365/94, 95, 96, 97, 98, 99, 100, 101, 102, 103, 104, 105, 230, 239, 240

[56] References Cited

U.S. PATENT DOCUMENTS 3,921,142  11/1975  Bryant et al. ..................... 364/900

Primary Examiner—Gareth D. Shaw
Assistant Examiner—Thomas M. Heckler
Attorney, Agent, or Firm—William K. McCord; James T. Comfort; Melvin Sharp

[57] ABSTRACT

A Read-Only-Memory (ROM) is addressed with a binary coded decimal (BCD) address in an address register or program counter. The ROM comprises an array of memory cells with associated row and column lines for addressing the array. Row and column decoders responsive to the address in the address register identify a unique row and column line for each BCD address. The row and column decoders comprise a plurality of decoders in cascaded levels. The decoders in any given level decode particular bits of the address in the address register; these decoders decode a one-out-of-a-prime-number, which prime number is a factor of the number of memory locations in the array.

4 Claims, 60 Drawing Figures

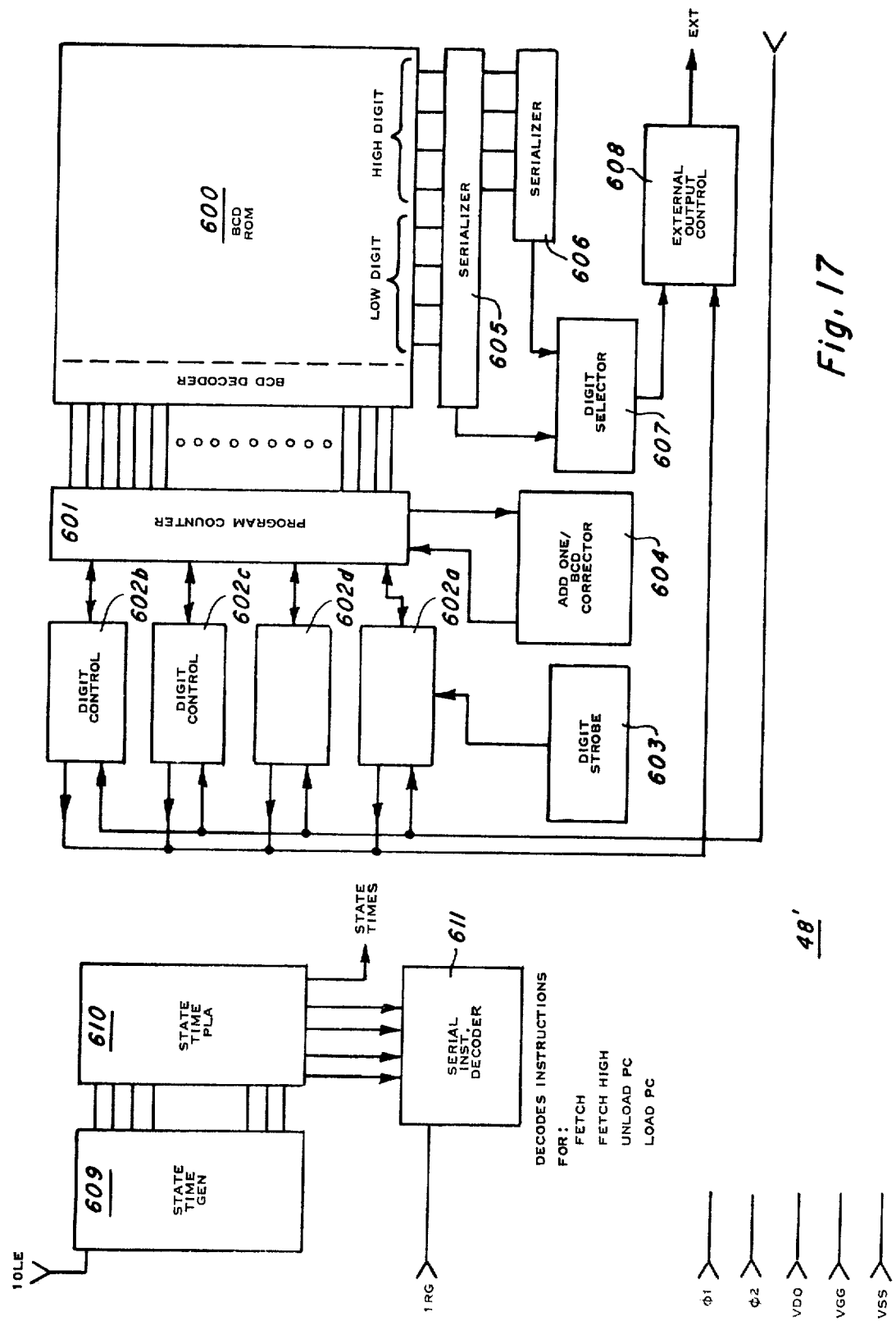

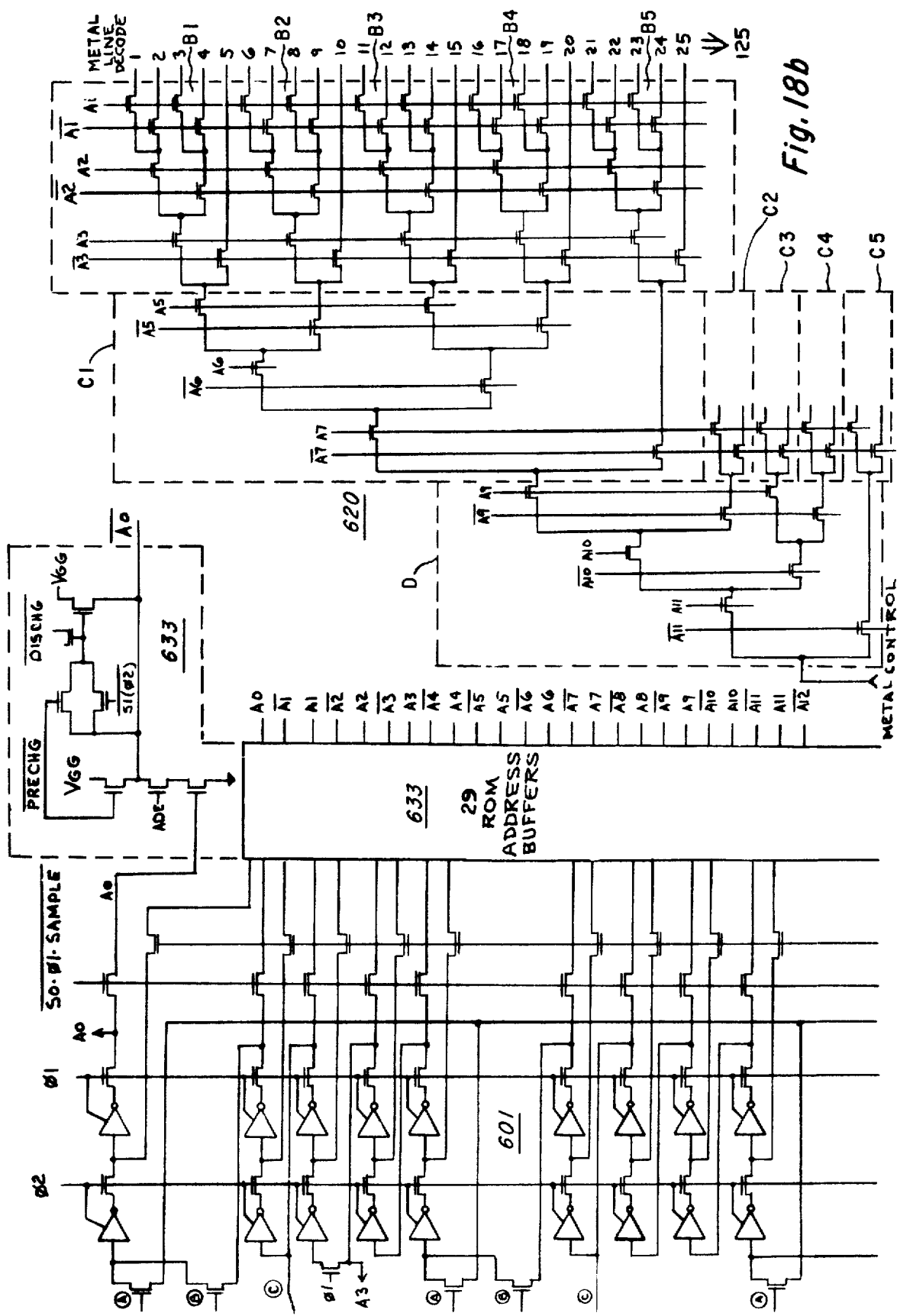

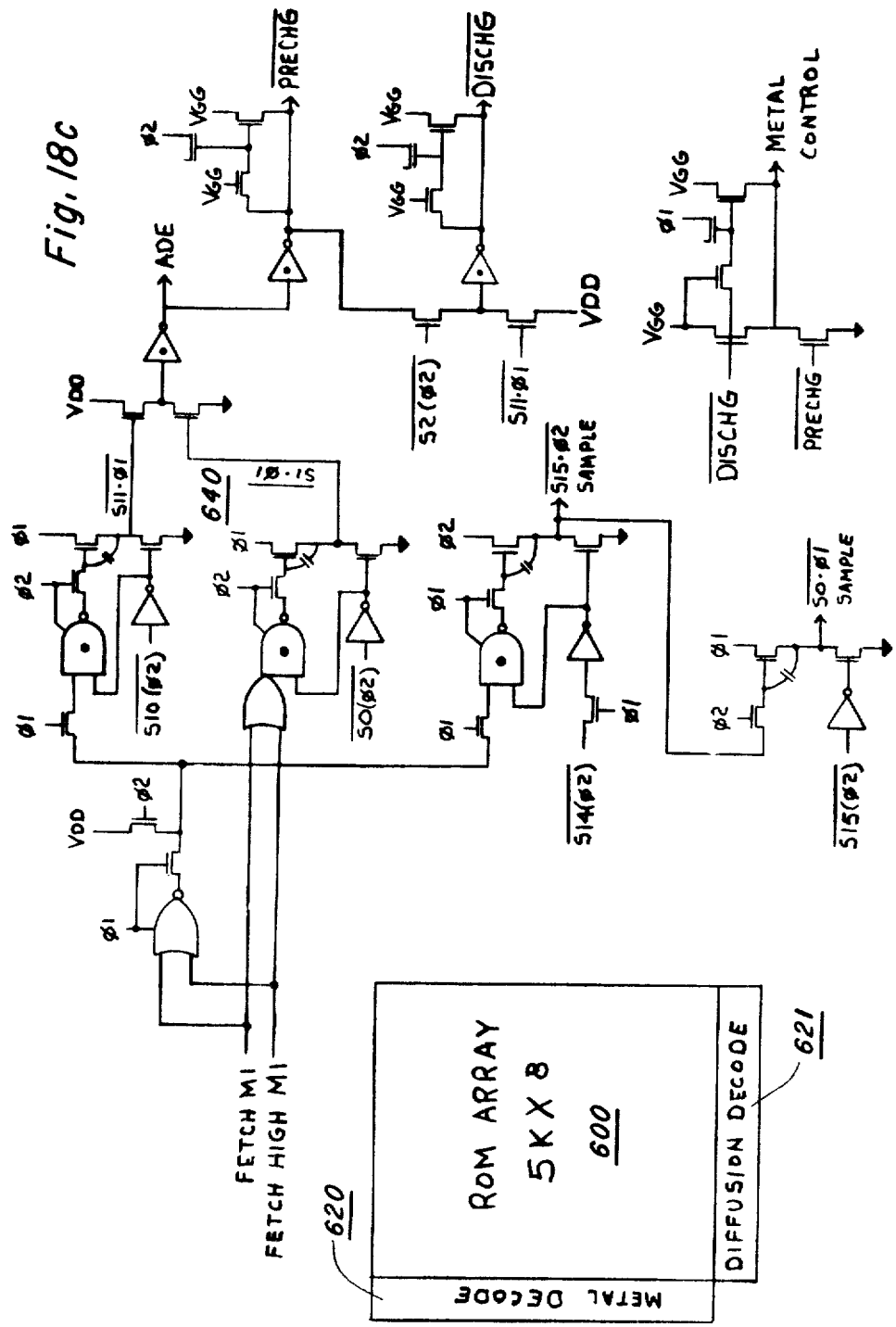

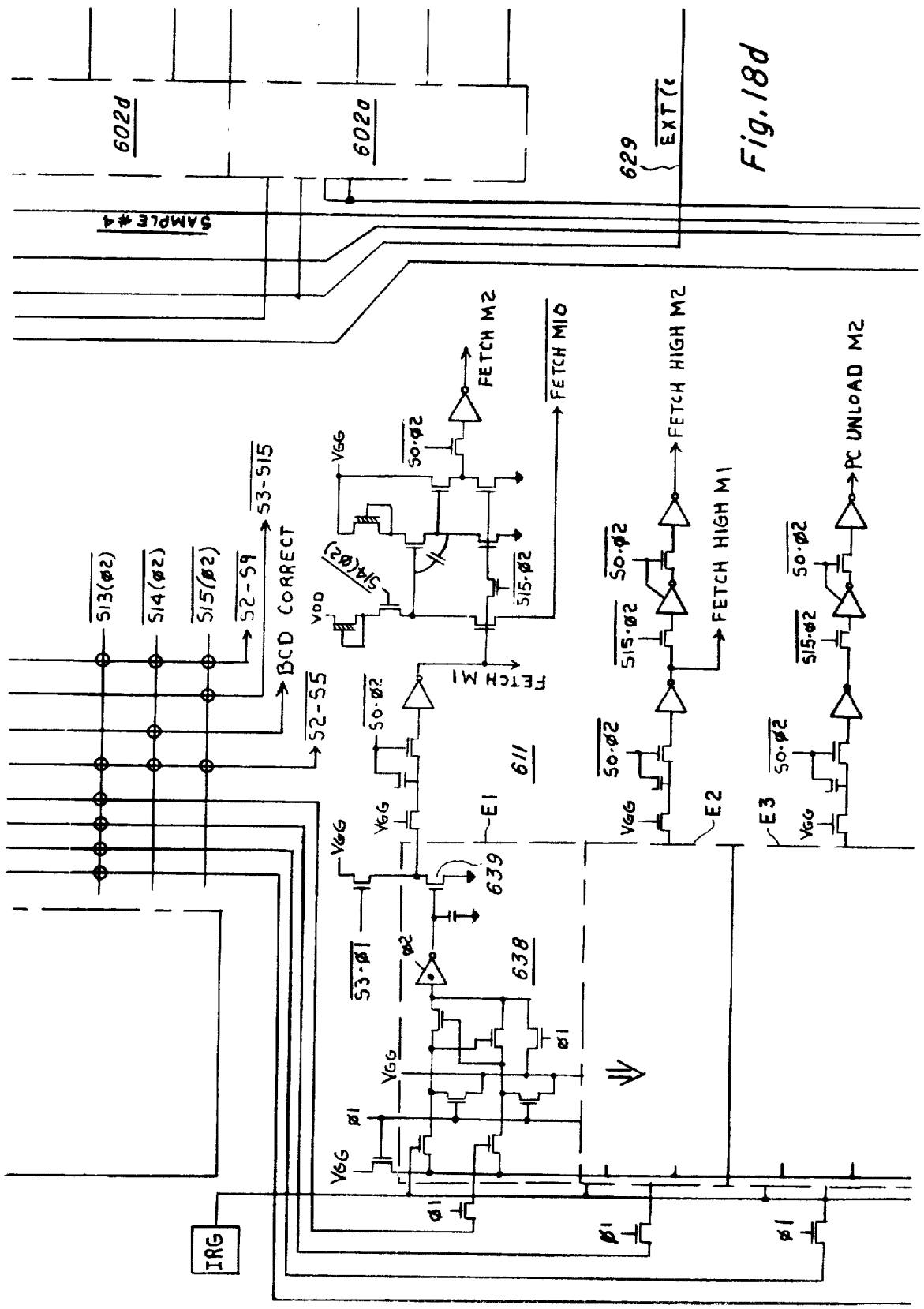

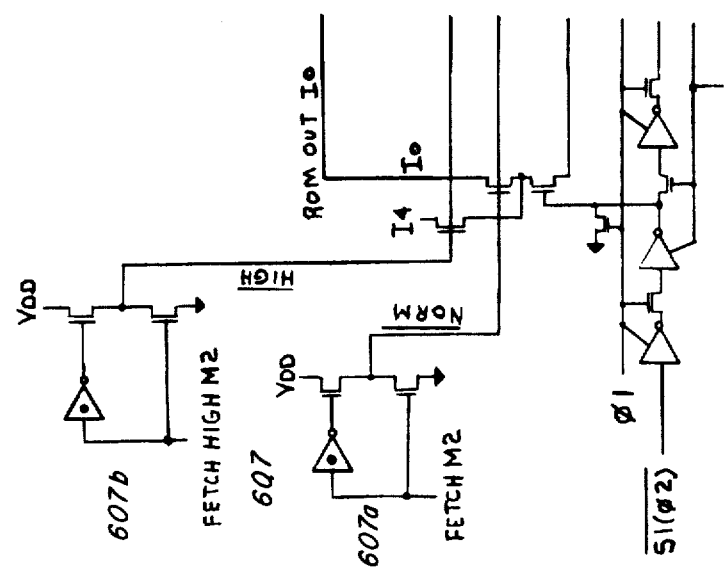
Fig. 18e
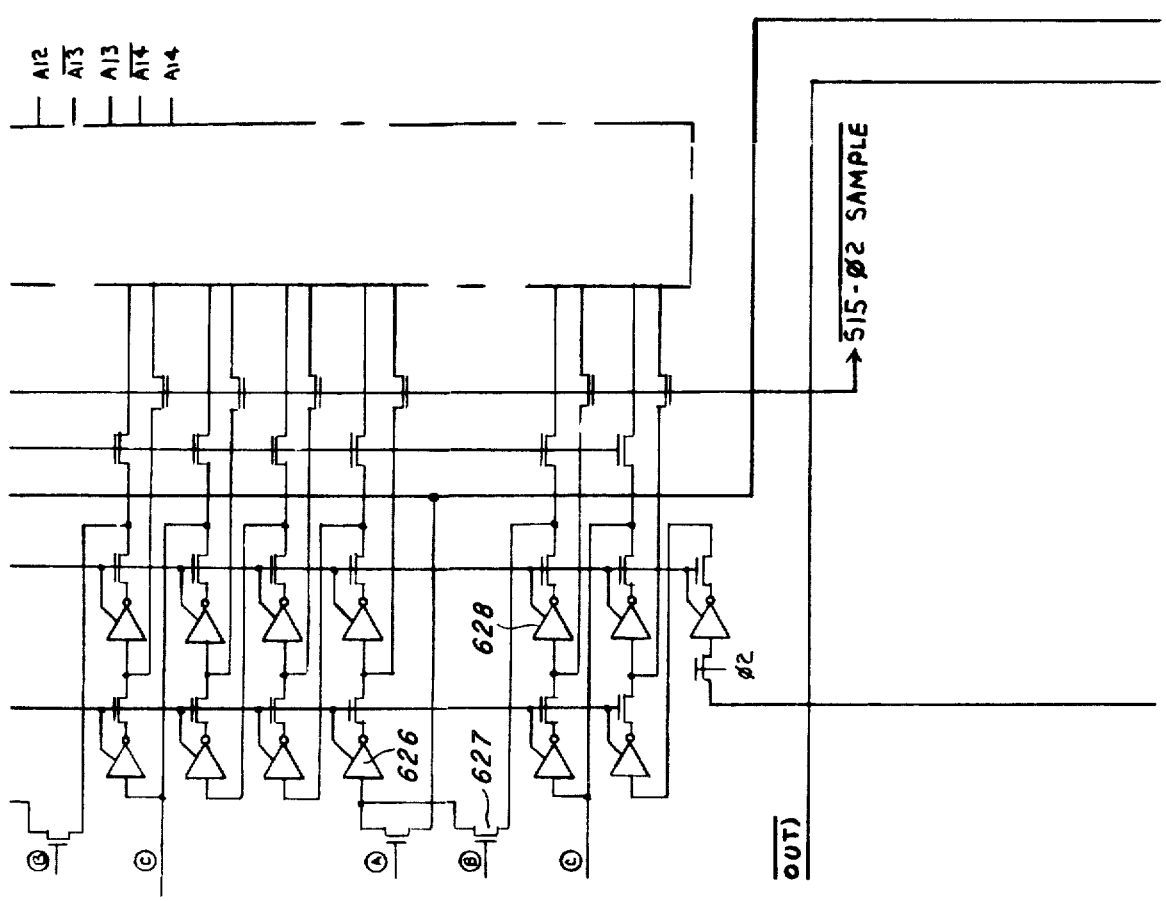

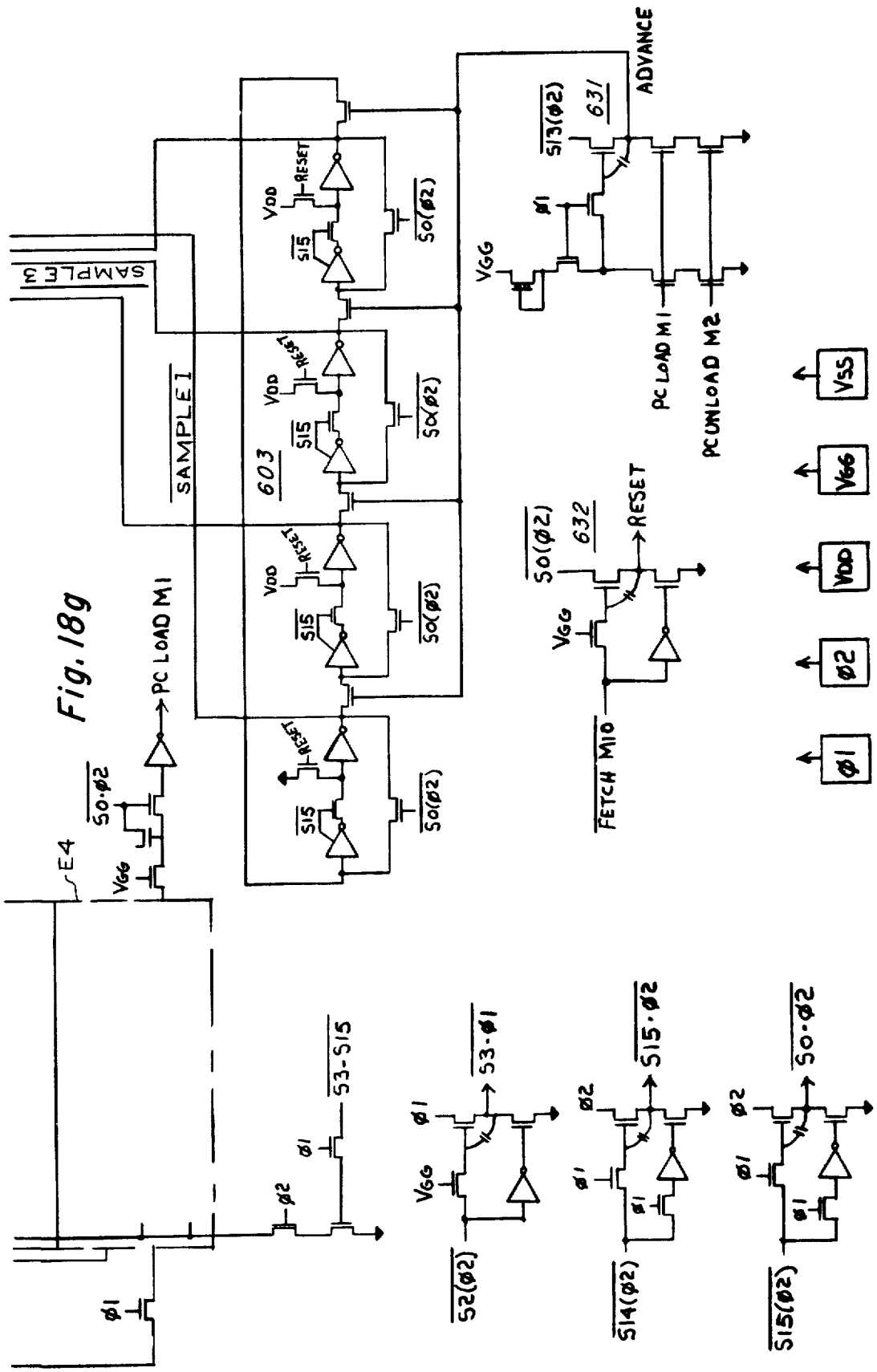

BINARY CODED DECIMAL ADDRESSED READ-ONLY-MEMORY

BACKGROUND OF THE INVENTION

This invention relates to read-only-memories and more particular to a read-only-memory addressable by binary coded decimal (BCD) data.

Read-only-memories are now well known in the art and, during the past few years, read-only-memories (ROMs) have seen extensive use in calculator and microprocessor chips implemented in metal oxide silicon (MOS) technology. In these prior art applications, the read-only-memories have been provided by an array of memory cells which are typically responsive to an address contained in an address register or program counter for outputting an instruction word or program code in response thereto. The address in the address register or program counter has typically been in binary format, which of course, may be expressed as an octal, hexadecimal or binary number.

Disclosed herein is a calculator system which incorporates the BCD decoder ROM of my invention. As will be explained in more detail, provided is a main ROM or first ROM which is responsive to a binary address in a program counter for outputting instruction words and a second ROM is responsive to a binary coded decimal address in another address register for outputting program codes. The second ROM may be addressed by the operator keying-in appropriate commands at the calculator's keyboard. As will be seen, this addressing may be done by the use of appropriate labels or by entering a relative address into the calculator system from the calculator's keyboard. Inasmuch as this calculator, and for the matter most calculators, is provided with a decimal keyboard, the addresses used to address the second ROM are preferably BCD addresses. If, however, second ROM were provided by a conventional ROM of the type heretofore known in the prior art, then approximately six sixteenths of the total ROM area would not be utilized by the BCD addressing, and therefore would be wasted. Alternatively, the BCD address could be converted to hexadecimal and a conventional ROM used, but then circuitry to performm the BCD-hex conversion would tend to increase the size of the chip.

It is therefore one object of this invention to provide a ROM responsive to a BCD address. It is another object of this invention to reduce the amount of wasted space which would exist in a conventional ROM addresses only by BCD addresses. It is yet another object to eliminate the need for BCD to hexadecimal conversion circuitry.

The foregoing objects of this invention are achieved as is now described. A matrix or array of memory cells having column and row lines is addressed by decoders for the row and column lines thereof. The row and column decoders typically have a cascaded arrangement of differing levels. All the decoders on any given level decode the same bits of the BCD address in an address register. The bits decoded by a decoder at any given level preferably correspond to a number in base ten which is a prime number. That is, these decoders may be one-out-of-two, one-out-of three, one-out-of five, one-out-of-seven, one-out-of-eleven or the like decoders. These prime numbers for each level are a factor of the total number of program codes stored in the BCD ROM. In the embodiment disclosed, 5,000 program codes are storable in the BCD read-only-memory, with the row decoder comprising three levels of cascaded one-out-of-five decoders for providing a one-out-of-125 row decoder. The column decoder comprises three levels of cascaded one-out-of-two decoders and a cascaded one-out-of-five decoder for providing a one-out-of-40 column decode. It should be evident, moreover, that the particular number of program codes in a given BCD ROM and the relative sizes of the column and row line decoders are design choices within the scope of this invention.

BRIEF DESCRIPTION OF THE DRAWINGS

The novel features believed characteristic of the invention are set forth in the appended claims. The invention itself, however, as well as further objects and advantages thereof, will be best understood by reference to the following detailed description of an illustrative embodiment, when read in conjunction with the drawings, wherein:

FIG. 1 is a pictorial view of an electronic portable calculator of the type which may embody the invention;

FIG. 2 is a simplified block diagram of a multi-chip calculator system which may be utilized in practicing the present invention;

FIGS. 3a–3b are detailed block diagrams of the arithmetic chip featured in FIG. 2;

FIG. 4 is a detailed block diagram of the SCOM chip featured in FIG. 2;

FIGS. 5a–5e depict in representative form the instruction words decoded by the arithmetic and SCOM chips;

FIG. 5f depicts the originization of the EXT signal;

FIG. 5g depicts the first ROM address as stored in the address register;

FIG. 5h depicts the instruction words decoded on the second ROM chip and selected instruction words decoded on the arithmetic chip, but which may be conveniently employed in connection with the utilization of second ROM chip;

FIGS. 6a–6b are timing diagrams showing the timing of various parts of the multi-chip system;

FIG. 7 is a representation of the keyboard input matrix;

FIGS. 8a–8d are a composite schematic diagram of the arithmetic chip of FIG. 2;

FIGS. 9a–9e are a composite schematic diagram of the SCOM chip of FIG. 2;

FIGS. 10a–10r are schematics of certain circuits used in FIGS. 8a–8d and 9a–9e;

FIG. 11 is a block diagram of a modern electronic calculator equipped with one embodiment of the invention;

FIG. 12 is a block diagram of another embodiment of the invention which may be utilized with a modern electronic calculator of the type depicted in FIG. 11;

FIG. 13 is a pictorial view of an electronic calculator having an opening for removeably receiving a packaged second second ROM chip;

FIG. 14 is a simplified block diagram of a multi-chip calculator system utilizing the present invention;

FIG. 15 is a function diagram of the logical organization of data stored in the second ROM;

FIG. 16 depicts the variable boundary between data and program steps in the calculator's memory;

FIG. 17 is a block diagram of the second ROM chip;

FIGS. 18a–18i form a composite schematic diagram of the second ROM chip; and

FIG. 19 is a representation of data stored in the memory registers on the double SCOM chips.

LOCATION OF THE DRAWINGS

Figure 18A:
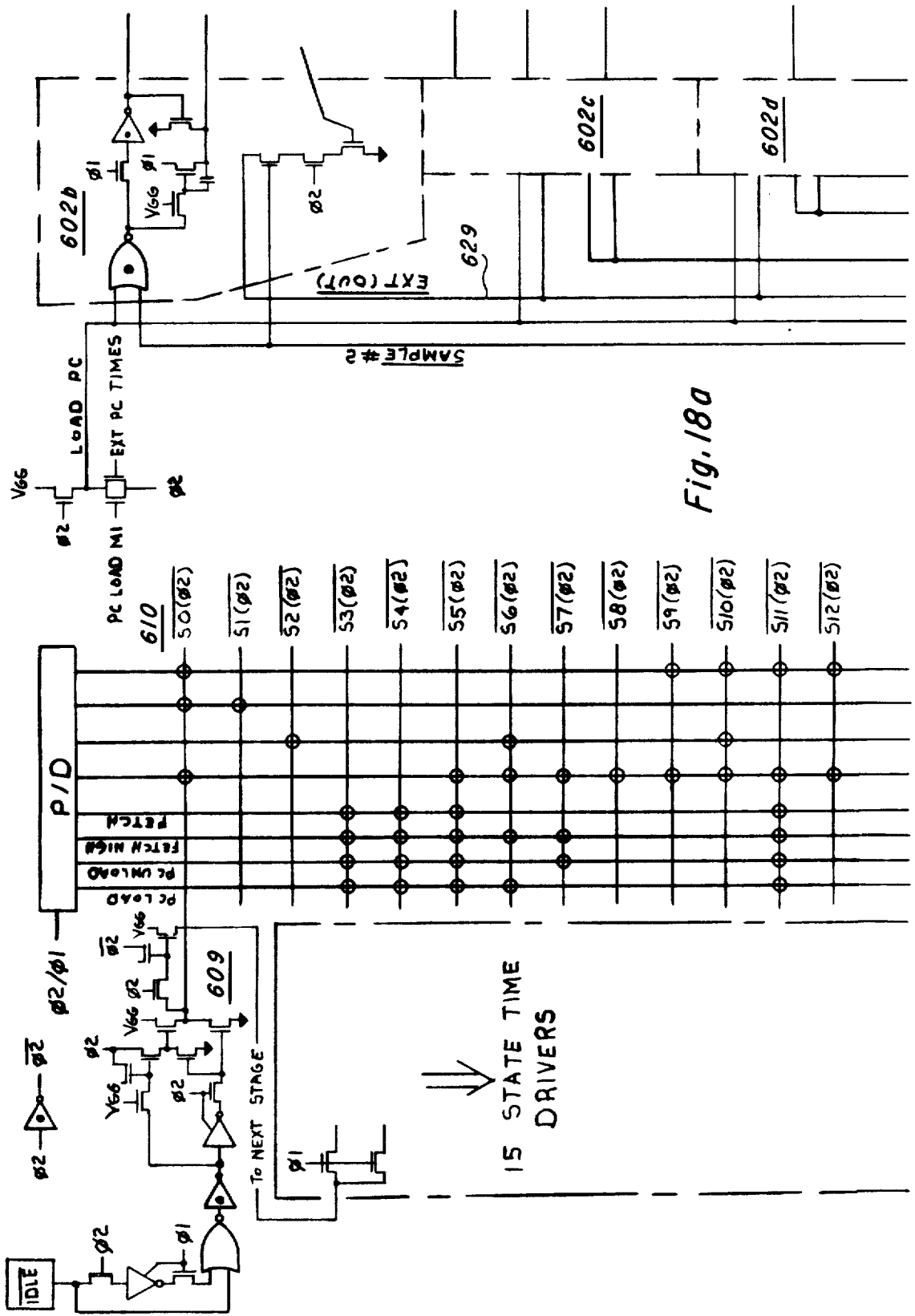
Figure 18F:
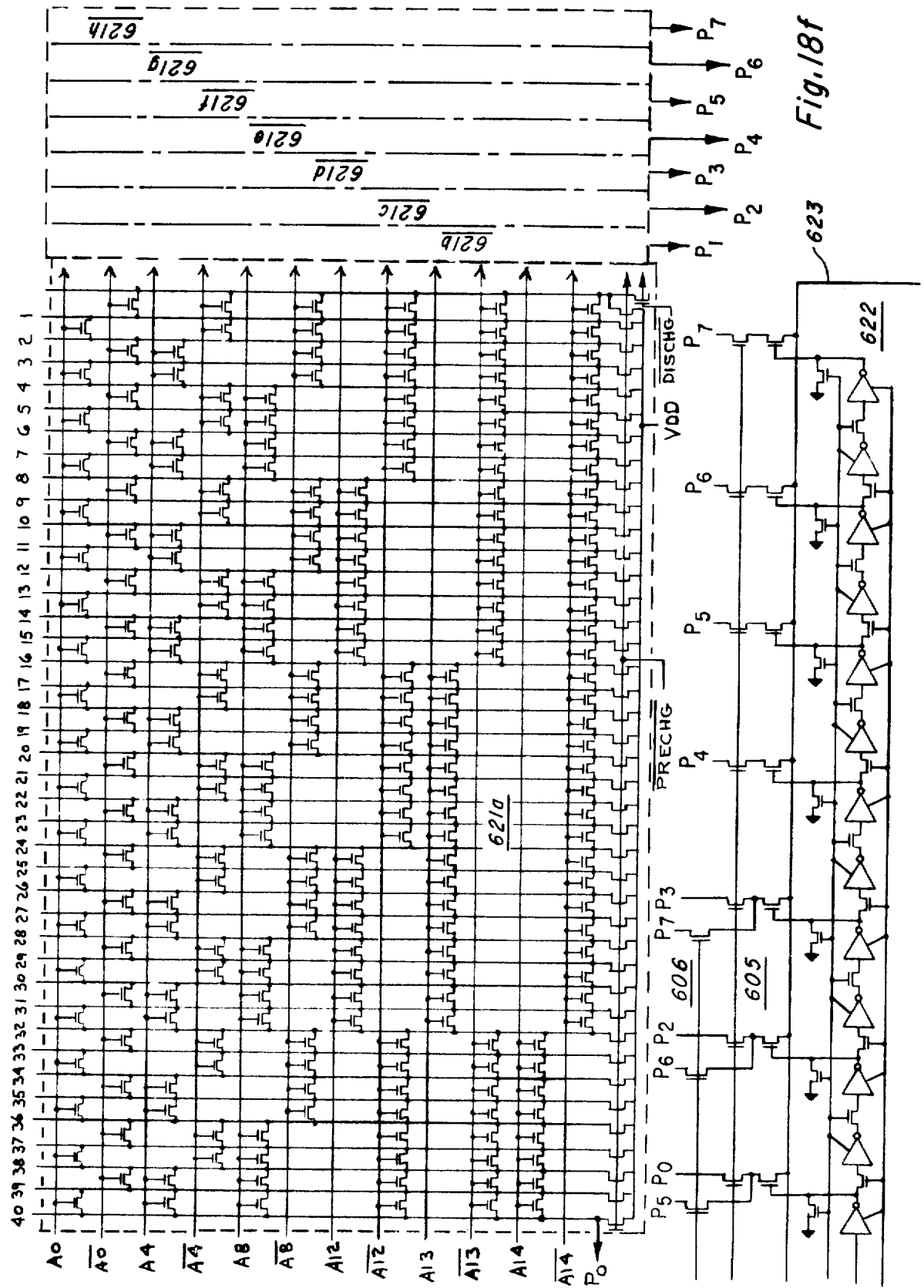
Figure 18H:
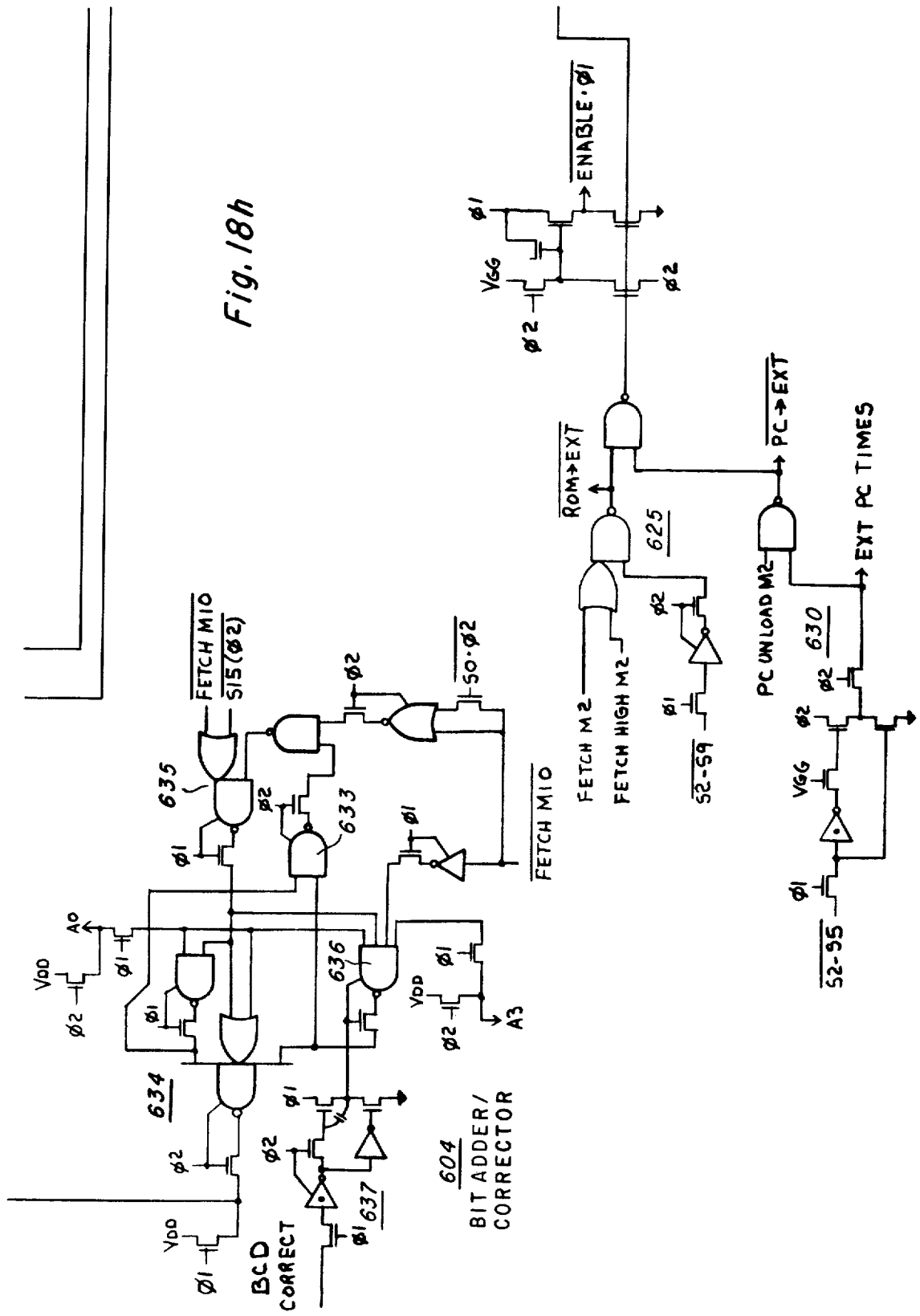
Figure 18I:
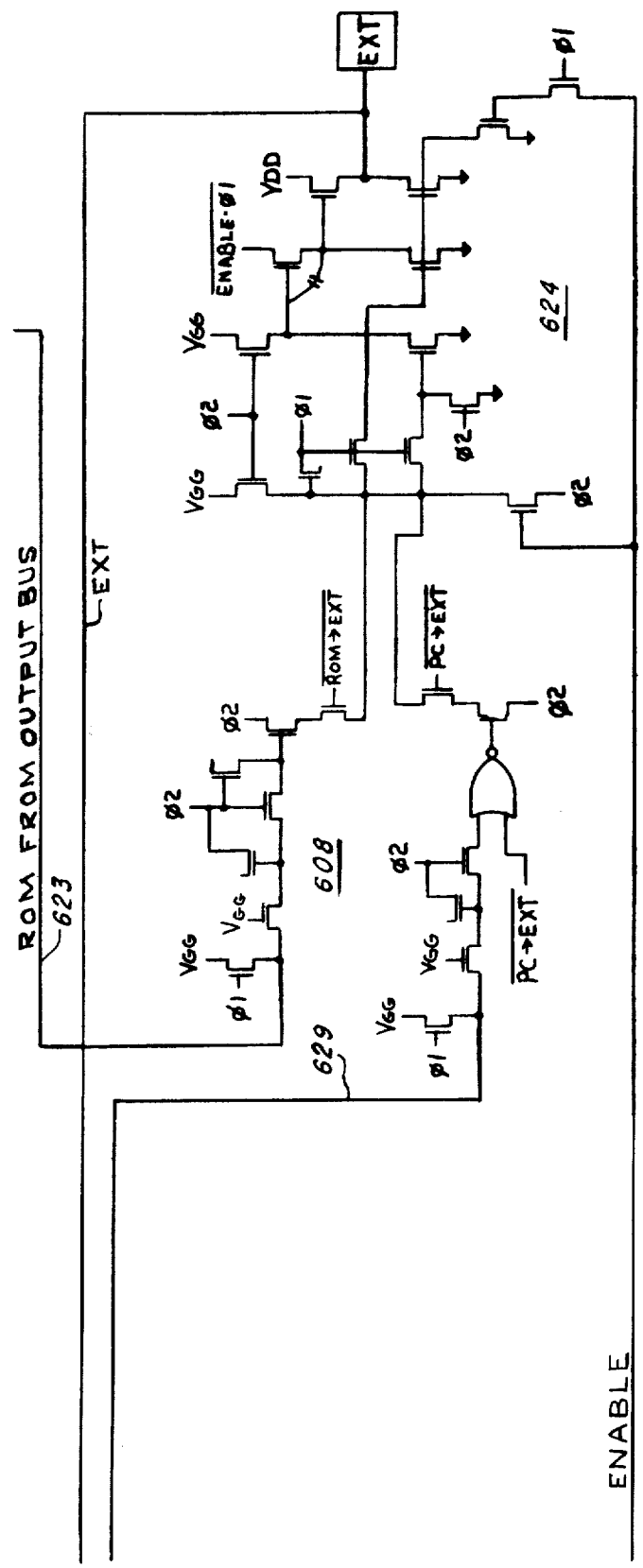

FIGS. 17–18 accompany this patent. FIGS. 2, 3a–3b–4, 5a–5g, 6a–6b, 8a–8d, 9a–9e and 10a–10r are hereby incorporated by reference to U.S. Pat. No. 3,900,722, entitled "Multi-Chip Calculator System Having Cycle and Subcycle Timing Generators", which issued on Aug. 19, 1975 to Michael J. Cochran and Charles P. Grant, Jr. and which is assigned to the assignee of this invention. FIGS. 1, 5h, 7, 11–16 and 19 are hereby incorporated by reference to U.S. Patent application Ser. No. 783,903 filed Apr. 1, 1977 now U.S. Pat. No. 4,153,937.

DETAILED DESCRIPTION

An electronic calculator system having high order capability, which uses the present invention, will be described with reference to two U.S. Patents or applications. Line 21, column 4 through line 31, column 44 of U.S. Pat. No. 3,900,722 and the entirety of U.S. Patent application Ser. No. 783,903 is incorporated herein by reference. For a complete understanding of the calculator system employing the present invention, as well as definitions and explanations of the control and timing signal referred to herein, reference should be made to the aforementioned U.S. Patents. It should be appreciated that the following is a detailed description of one chip, used in a multi-chip calculator system and a description of other chips preferably used with the chip herein discribed is contained in the aforementioned U.S. Patents.

The Read-Only-Memory (ROM) disposed on this chip is called the second ROM and it is used to store a plurality of program codes, each program code being effective for addressing a set of instruction words stored in a main program ROM (and referred to as a first ROM). Inasmuch as the address used to address the second ROM may be altered by a relative amount with appropriate keyboard inputs and since the keyboard includes a decimal number keyboard, the second ROM is addressed by a BCD address in an address register. The address register is, in this embodiment a shift register and add one/BCD corrector circuit is included to increment the address in the address register in response to a control signal. A decoded FETCH instruction supplies this control signal in this embodiment.

The tables referred to herein are hereby incorporated by reference to the aforementioned U.S. Patent application Ser. No. 783,903.

DESCRIPTION OF THE SECOND ROM CHIP AND THE INTERFACE BETWEEN THE SECOND ROM CHIP AND THE OTHER CALCULATOR CHIPS

Referring now to FIG. 17, there is shown a block diagram of second ROM chip 48'. The second ROM 48 implemented thereon, is provided by binary coded decimal (BCD) ROM 600. The output of BCD ROM 600, which outputs the program codes listed in TABLE III, for instance, is connected to serializers 605 and 606. Serializer 605 converts both the high digit and low digit of the program code to serial format and supplies it to a digit selector. The serializer 606 converts only the high digit of the program code to serial and also supplies it to digit selector 607. Digit selector 607 provides the output of serializer 605 to external output control 608 in response to a decoded FETCH instruction or supplies the output of serializer 606 to external output control 608 in response to a decoded FETCH HIGH instruction.

BCD ROM 600 is addressed by an address in program counter 601. The address in program counter 601 preferably is a BCD four digit numeral. The address in program counter 601 is incremented each time a FETCH (but not a FETCH HIGH) instruction is decoded and is maintained in BCD format by an one bit/BCD corrector 604. Program counter 601 may be loaded one digit at a time with a digit appearing on External (EXT) via digit controls 602a–602d. Digit strobe 603 controls which one of the digit control 602a–602d is enabled; digit strobe 603 sequentially enables digit controls 602a–602d in response to a decoded UNLOAD PC (unload program counter) or a LOAD PC (load program counter) instruction. Digit strobe 603 is reset by a decoded FETCH instruction. The digit control 602a–602d enabled by digit strobe 603 inputs a single digit (four bits) of the four digit number from the EXT bus in response to a decoded LOAD PC instruction, the number being obtained from the bits occurring during state times S3–S6 on the EXT bus. Also, the enabled digit control 602a–602d outputs a digit from program counter 601 to the EXT bus in response to a decoded UNLOAD PC instruction.

State time generator 609 outputs an indication to state time PLA 610 of which one of the 16 possible state times of an instruction cycle the calculator is in. State time generator 609 is responsive to IDLE for maintaining the state times generated thereby in phase with state times generator on the arithmetic chip 10 or double SCOM chips 12a and 12b, for instance. State time PLA 610 outputs selected timing signals to the various logic circuits and also to serial instruction decode 611. Serial instruction decode 611 is also responsive to the serial instruction words appearing on IRG. Serial instruction decode 611 decodes the aforementioned FETCH, FETCH HIGH, UNLOAD PC and LOAD PC instructions.

External output control 608 outputs the serialized low and high program code digits or the serialized high digit alone from digit selector 607 in response to the FETCH and FETCH HIGH instruction, respectively, and outputs the digit from the enabled digit control 602a–602d in response to an UNLOAD PC instruction, the output from external output control being provided to the EXTERNAL bus.

Considering FIGS. 3a and 3b with FIG. 17, the following discussion examines the flow of data between second ROM chip 48', arithmetic chip 10 and the main ROMs 20a–20c. When a program is to be called from second ROM chip 48' according to the aforementioned 2ND, PGM, page number and label key sequence, the location 0000 is first loaded into the program 601. This may be done for instance by (1) zeroing a selected register 50a–50e, which loads the zero in register R5 65. As disclosed in the incorporated by reference U.S. Pat. No. 3,900,722, register R5 65 is automatically loaded with the least significant digit after some arithmetic operation involving the arithmetic unit and Register R5 65 may be loaded with the least significant digit in keyboard register 54 in response to a KRR5 instruction. Also the least significant digit of keyboard register 54 may be loaded with the contents of register R5 65 in response to a R5KR instruction. Now, the zero digit in register R5 65 is loaded into the least significant digit position of keyboard register 54. After having reset digit strobe with a FETCH instruction, the zero is loaded into each of the four digits of program counter 601 by four sequential LOAD PC instructions, thereby transferring the zero in the LSD of the keyboard register into all digit positions of program counter 601. Then a FETCH HIGH instruction is issued followed by a load keyboard with EXTERNAL (EXTKR) instruction for loading high digit of the program code outputted from ROM 600 into the keyboard register. The contents of keyboard register 54 is then loaded into register R5 65 and thence into a register 50a–50e using an R5→Adder instruction (FIG. 5b). This high digit may then be shifted in its register to the next more significant digit position by register shift instructions (FIG. 5b). A FETCH instruction then follows, which is followed by an EXTKR, KRR5 and R5→Adder instructions to load the low digit into the register in which the high digit had been previously loaded, thereby providing the high and low digits in one of the operational registers 50a–50e. This number may then be subtracted with the inputted page number to determine whether the inputted page number is available in ROM 600.

As can be seen, having an R5 register of a single digit length complicates the transferring of the low and high order digits of the program code into an operational register 50a–50e. It should be evident that an eight bit register R5 65 would simplify this process; the method herein described is used because register R5 in the pre-existing arithmetic chip 10 only has four bit positions. Modification to the above described instruction sequence for a calculator system having an eight bit R5 register 54 should be evident to those skilled in the art.

It should be also evident to those skilled in the art that this addressing sequence could be simplified if the I/O bus were used in lieu of EXT. Then, however, additional connections would be necessary to interface the second ROM chip 48' with the rest of the calculator system, thereby complicating the plug assembly for interfacing chip 48' with the remainder of the calculator system.

Assuming that the inputted page number is available in ROM 600, the inputted page number is multiplied by two and the resulting address is loaded one digit at a time into program counter 601 via register R5 65, keyboard register 54 and the EXT bus. As has been previously discussed, the two program codes at that location and the following location in ROM 600 are read out thereof one digit at a time using a sequence of FETCH HIGH, EXTKR, KRR5, KR→Adder, SHIFT, FETCH, EXTKR, KRR5, R5→Adder, SHIFT instructions and so forth in the manner previously set forth for four digits. At this time, the four digit address of the first program code for the inputted page number has been loaded into a selected register 50a–50e. This process is then repeated for the next two program codes, which are loaded into another register, this address defining the first program code on the page immediately following the inputted page number. The difference of these two numbers is taken and stored and the address of the program code on the inputted page is then loaded one digit at a time into program counter 601 by generally reversing the above sequence and substituting the FETCH and FETCH HIGH instructions with LOAD PC instructions, thereby loading program counter 601 with the address of the first program code on the inputted page number. The program codes are then read out sequentially and compared with the inputted label, the calculator testing for a match thereof. For each FETCH operation accomplished during this label search, the aforementioned difference is decremented by one. If the decrementing difference becomes equal to zero before a match is found, the calculator generates an error condition inasmuch as the label being searched for does not exist on the particular page inputted by the operator. Once the inputted label is detected, the outputted program codes are loaded into program counter 54 which in turn is used to address main ROMs 20a–20c when a PREG instruction is generated telling main ROMs 20a–20c to branch on the address being outputted on EXT. The microcode at that address is then read out in the usual manner to accomplish the function indicated by the outputted program code, that sequence of events taking between fifty and several thousand instruction cycles, for instance. At the end of this sequence of instructions, a flag is tested to determine whether another program code is to be read from second ROM 48, or whether a program code is to be read from the program code storage area in RAMs 14a–14c, whether a program code is to be read from the aforementioned constant ROM area in double SCOM chips 12a or 12b or whether the calculator is simply to await another keyboard input by the operator. This flag in a memory on one of the double SCOM chips; the control of which the above-mentioned elements control calculator operation will be subsequently discussed. Assuming control is to be directed back to second ROM 48, FETCH and PREG instructions will again be issued to cause the calculator to branch to the location defined by the subsequent program code in second ROM 48. This process will be repeated until a RETURN program code is loaded into keyboard register 54, and main ROM 20a–20c branches to the location defined thereby; there instructions transfer control back to normal keyboard inputs and the display is activated with the contents of register A, unless of course, the above-mentioned 2ND, PRGM, page number, label key sequence occurred as a separate chain in a user inputted program in RAMs 14a–14d, in which case, control would be then returned to the program thereat.

It has previously been indicated that after the page number has been inputted, a label search is commenced on that page by inputting an appropriate label, i.e. either the labels A–E or A'–E' or the subroutine key (SBR) combined with a non-numeric key (indicating that such key is being used as a label) or a three digit number (which is treated as a relative address, as aforementioned). It should be appreciated that data may be entered into the memories, including the display register, after the page number is inputted and before the label or relative address is inputted. In fact, many of the programs in the embodiment of second ROM 48 programmed according to Table VIII assume that the number in the display at the time the label is inputted is to be used during the execution of the program identified by the label.

Referring now to composite FIG. 18a–18i, there is shown a detailed logic diagram of second ROM chip 48'. BCD ROM 600 is implemented as a conventional virtual ground type ROM of the type disclosed in U.S. Pat. No. 3,934,233, entitled "Read-Only-Memory For Electronic Calculator", which issued Jan. 20, 1976 and is assigned to the assignee of this invention. Decoders 620 and 621 used in addressing ROM 600 are important features of this invention which permit ROM 600 to be addressed using BCD data without wasted space within ROM 600. The decoders heretofore known in the prior art, such as those exemplified by U.S. Pat. No. 3,934,233, decode either binary, octal, or hexadecimal data, as the case may be. These decoders may be used with a ROM to decode BCD data, of course; however, in that case, large portions of the ROM would go unused inasmuch as hexadecimal numbers 11 through 16 would be decodable, but have no need to be decoded. Using the addressing scheme herein disclosed, permits the addressing of ROM 600 with BCD data without the wasted space within the ROM which would otherwise result with conventional decoders.

ROM 600 is implemented as a 5000×8 bit array for storing 5000 eight bit program codes, the addresses thereof being the BCD encoded numerals 0000–4999. These four numerals are stored in program counter 601. Decoders 620 and 621 are able to decode these 5000 addresses without decoding the non-BCD codes often seen in the binary data contained in a register such as program counter 601. As will be seen, the ROM metal line decoder 620 uniquely decodes the one of 125 metal lines while the ROM diffusion line decoder 621 decodes one out of forty diffusion lines for each bit in a program code. Inasmuch as 125×40 equals 5000, 5000 program codes in ROM 600 will be uniquely identified by metal decoder 620 and diffusion decoder 621.

Metal decoder 620 comprises a plurality of one of five decoders. These one of five decoders are provided in a three level cascaded arrangement inasmuch as 5×5×5 equals 125. Referring to dashed lines B1–B5, it can be seen that the dashed line B1 encompasses a one of five decoder, as do references dashed lines B2–B5. The inputs of one of five decoders B1–B5 are connected to the outputs of one of five decoder C1, all of which are used to perform a one out of twenty-five decode. One of five decoders C2–C5 are identical to one of five decoders B1–B5. The five outputs from one of five decoders C2–C5 are each coupled to one of five decoders like B1–B5 (not shown) for providing the decoding of metal lines 26–125. The inputs of one of five decoders C1–C5 are connected to the output of a third level one of five decoder identified by a reference line D. The B level decoders (e.g. B1–B5) are responsive to the A1–A3 bits outputted from program counter 601, while the C level decoders are responsive to the A7–A5 bits and the D level decoder is responsive to the A9–A11 bits from program counter 601. The remaining bits, (e.g. A0, A4, A8, A12, A13, and A14) are decoded by diffusion decoder 621, for providing a one out of forty decode. Diffusion decoder 621 is divided into eight sections 621a–621h for addressing the eight bits of the addressed program code. As can be seen decoder section 621a has one output line ($P_o$) one ground line and 39 intermediate diffusions, inasmuch as ROM 600 is of the virtual ground type. Decoder sections 621b–621h are identical to section 621a, but output the $P_1$–$P_7$ bits of the program code.

It should be evident that decoder 621 performs a one out of two decode for address lines A0, A4 and A8 and performs a one out of five decode for address lines A12–A14. It should be evident to one skilled in the art, moreover, that other configurations of decoders 620 and 621 could be utilized. For instance, metal decoder 620 could be arranged to perform a one out of 250 decode by doubling the size of that decoder and adding a one out of two decoder of line A0, for instance, in front of the D level decoders, while diffusion decoder 621 would perform a one of twenty decode by deleting the A0 address line 0 and collapsing the size thereof by deleting the odd numbered diffusion lines.

It should further be evident to those skilled in the art that similar BCD only addressing schemes may be used with other sizes of ROMs. For instance, a 7000 word ROM may be BCD addressed with a one out of 250 metal decoder (2×5×5×5) and an one out of twenty-eight diffusion decoder (2×2×7). As can be seen; the numbers in the parenthesis are the prime number factors of 7000.

Diffusion decoders sections 621a–621h output the $P_0$–$P_7$ bits of the program, respectively. The $P_0$–$P_7$ bits are outputted serially on external during state times $S_3$–$S_{10}$ in response to a decoded FETCH instruction while bits $P_4$–$P_7$ are to be outputted serially on external during $S_3$–$S_6$ in response to decoder FETCH HIGH instruction, as aforementioned. The $P_0$–$P_7$ bits from decoder 621 are connected to bus 623 when strobed by shift register 622 beginning at $S2\phi2$ for the $P_0$ bit and when enabled by logic 607a in response to a decoded FETCH instruction. Bits $P_4$–$P_7$ are conducted to bus 623 starting at state time $S2\phi2$ when strobed by shift register 622 provided logic 607b receives a FETCH HIGH command. Bus 623 is coupled to the EXT line via external output buffer 624 when enabled by external output control 608. Control 608, in combination with logic 625, couples bus 623 to buffer 624 in response to either a FETCH or FETCH HIGH command. The data on bus 623 is one-half bit early due to a one-half bit delay in buffer 624.

Program counter 601 is provided by a 15½ bit shift register, comprising thirty-one inverters. The other half bit a delay occurs in the one bit adder/BCD corrector 604, thereby providing sixteen bits of storage for storing four BCD numerals. The least significant digit in program counter 601 is loadable from a four bit serial numeral appearing on EXT during state times $S_3$–$S_6$ via digit control 602a in response to a LOAD PC command. As can be seen from FIG. 18, digit control 602a inserts a new digit in the least significant digit position in program counter 601 by coupling the data on EXT to inverter 626 and opening-circuiting transfer gate 627 connecting inverter 628 to inverter 626. Inverters 626 and 628 are two of the thirty-one inverters in program counter 601. Digit control 602a also outputs to bus 629 serial data stored in program counter 601 when enabled by digit strobe 603, the digit appearing on line 629 being one-half bit early compared to the time at which it will be outputted on EXT in response to a decoded UNLOAD PC instruction.

Digit controls 602b–602d are identical to digit control 602a, except that they are connected to program counter 601 at appropriate places in the shift register therein to interface with the next to the least significant digit through most significant digit positions during the $S_3$–$S_6$ state time period. Bus 629 is connected to external output control 608 which functions in combination with logic 630 for conducting the BCD digit outputted from the enabled digit control 602a–602d through to EXT during $S_3$–$S_6$ in response to a decoded UNLOAD PC instruction. Bus 629 is one-half bit early compared to the data on EXT, because of the one-half bit delay associated with output buffer 624.

Digit strobe 603 is comprised of a four bit ring shift register counter for sequentially enabling one of the digit controls 602a–602d. Shift register 603 advances in response to a LOAD PC or UNLOAD PC command by logic 631; shift register 603 is reset for enabling the LSD digit decoder 602a in response to a decoded FETCH instruction by a logic 632.

The four digit BCD number stored in program counter 601 shifts through program counter 601 and from the output thereof back to the input thereof via the one bit adder/BCD corrector 604 each instruction cycle. The contents of shift register 601 is coupled to thirty ROM address buffers 633 during $S_{15}.\phi2$ through $S_0.\phi1$. The output of the thirty address buffers 633 provide the $A_0$-$A_{14}$ and $\overline{A_0}$-$\overline{A_{14}}$ outputs to the metal decoder 620 and diffusion decoder 621. Only fifteen stages of the shift register in program counter 601 are outputted to ROM 600 via buffers 633 and decoders 620 and 621, inasmuch as the most significant bit of the most significant digit in program counter 601 need not be decoded when the largest address is 4999. It should be evident to one trained in the art, however, to utilize the outputs of all stages and to increase the size of the aforementioned decoder 620 or 621 to accommodate extra address lines for using larger addresses than 4999.

One bit adder/BCD corrector 604 is a single bit, serial adder that addes one to the stream of four BCD digits circulating through it from program counter 601 in response to a decoded FETCH instruction. During NON-FETCH (including FETCH HIGH) instructions, the four BCD digits circulate through one bit adder/BCD corrector 604 without the add one operation being performed. The one bit adder/BCD corrector 604 does a "look ahead" at the serial stream of data exiting from program counter 601 in order to determine if BCD correction is necessary when an add one operation is to be accomplished. When corrector 604 receives the least significant bit of a digit, it is also provided with the most significant bit of that digit for the "look ahead" operation. Corrector 604 is also provided with a clock signal, BCD CORRECT, for indicating to corrector 604 when the least significant bit of a digit is being received thereby. If during this time period the least significant digit is being inputted and a FETCH instruction has been decoded, one will be simply added to the least significant digit unless the first and last bits of that digit are both a logical one, (i.e., a decimal nine has been outputted), then in lieu of adding one, which would form the illegal BCD code 1010, a 0000 is outputted from corrector 604 in the corresponding four state times and an add one operation is accomplished on the next more significant digit via carry circuit 633 in corrector 604. Should that digit contain a nine, the above equation repeats and, if not, a one is added to that digit.

In one bit adder/BCD corrector 604, adder gates 634 perform the add operation when a one is outputted from add one insertion gate 635 unless inhibited by gate 636. Gate 635 is responsive to a decoded FETCH instruction and state time $S15\phi2$ for inserting a logical one into adder 634 in the least significant bit of the least significant digit or for inserting a one in the least significant bit when enabled by carry circuit 633. Gate 636 is responsive to a decoded FETCH instruction, the $A_0$ and $A_3$ bits from program counter 601 and the output of gate 635 for generating four logical zeros when a BCD nine is to be incremented during a FETCH instruction. Gate 636 is enabled by timing signal BCD correct at $S_4\phi1$, $S_8\phi1$, $S_{12}\phi1$ and $S_0\phi1$, the BCD correct signal being delayed 1½ state times by a logic 637. Thus once gate 636 outputs a logical zero disabling the output from adder 634, that condition remains for four state times until the BCD correct signal is again generated from PLA 610. Carry circuit 633 is responsive to adder 634 for generating carries within a digit and to gate 636 for generating carries between digits.

The state time generator 609 comprises sixteen state time drivers, the first of which is responsive to a timing signal on $\overline{IDLE}$ for sequencing the state times generated thereby with the state times generated on the other chips in the calculator system. The outputs from the sixteen state time drivers are supplied to a PLA 610 for providing various timing signals used, for instance, for outputting the program code during S3–S10, receiving and outputting single digit addresses during S3–S6 and the like. PLA 610 also outputs in serial fashion four serial trains of digits mimicking the LOAD PC, UNLOAD PC, FETCH HIGH and FETCH instructions which are outputted from the main ROM 20a–20c on IRG. Of course, IRG also transmits many instructions which are not decoded on chip 48'.

These four serial bit trains are supplied to four serial instruction decoder circuits E1–E4 in decoder 611, along with the instruction words appearing on IRG. Each decoder in serial instruction decoder 611 performs an exclusive OR function on the data from IRG and one of the bit trains fromm PLA 610. If the exclusive OR function is satisfied for all bit positions of the instruction word (indicating that there was a match between the instruction word outputted and the bit train from PLA 610), then either a LOAD PC, UNLOAD PC, FETCH HIGH or FETCH instruction has been decoded, depending, of course, on which bit train is provided to the particular decoder for which the exclusive OR function was satisfied. Cross-coupled gates 638 perform exclusive OR function and discharge NODE 639 when a mismatch occurs anytime during the exclusive OR operation. The decoder circuitry encompassed by reference lines E2–E4.

It should be remembered that in the calculator system disclosed, an instruction is normally decoded during one instruction cycle and performed during the following instruction cycle. Inasmuch as the UNLOAD PC, FETCH HIGH AND FETCH operations output data on EXT and considering that the keyboard register 54 in arithmetic chip 10 must be sensitized to input this data by a EXTKR instruction, the data to appear on EXT from chip 48' must appear one instruction cycle later than the normal instruction cycle for executing decoded instructions. That is, the FETCH, FETCH HIGH and UNLOAD PC instructions result in data being outputted on external during the second instruction cycle following decoding. ROM 600 is a relatively large ROM, so for FETCH, or FETCH HIGH instructions the precharge cycle begins during the beginning of the instruction cycle immediately following the decoding of the instruction (by the FETCH M1 and FETCH HIGH M1 signals) whereas the conditional discharge occurs about one instruction cycle later. Thus ROM precharge circuitry 640 is responsive to FETCH M1 and FETCH HIGH M1 whereas the logic 625, 607a, 607b, add one/BCD corrector 604, logic 632 and the like are sensitized to delayed FETCH instructions FETCH M2 or FETCH $\overline{M10}$.

I have described my invention in connection with certain specific embodiments thereof. It is to be understood that modification may now suggest itself to those skilled in the art and that this invention is not limited to the specific embodiment disclosed, except as set forth in the appended claims.

What is claimed is:

1. A binary coded decimal read-only-memory system comprising:
   (a) an array having rows and columns of memory cells,
   (b) row lines and column lines associated with said array,
   (c) an address register,
   (d) a one bit adder and binary coded decimal corrector for incrementing the address in said address register in response to a control signal and for automatically maintaining said address in binary coded decimal format, and
   (e) means for addressing said array via said row and column lines with the address in said address register, said addressing means being responsive to the binary coded decimal address in said address register for addressing selected row and column lines in said array and being non-responsive to non-binary coded decimal addresses for addressing any selected row and column lines thereby, said addressing means comprising a plurality of decoders, said decoders being cascaded in a plurality of levels, the decoders in any given level being responsive to a preselected portion of the binary coded decimal address in said address register.

2. The binary coded decimal read-only-memory system according to claim 1, wherein said preselected portion has a maximum binary address which is equivalent to the decimal equivalent of the largest number used in each digit position in said address register.

3. The system according to claim 1, wherein said address register stores a plurality of binary coded decimal digits, wherein the largest number stored in the nonmost significant digit positions is the number nine and wherein the largest number stored in the most significant digit position in a preselected number and wherein said plurality of levels of cascaded decoders includes a level of one-of-two decoders and a level of one-of-five decoders for each non-most significant digit position in said address register, each of said levels of decoders comprising one or more decoders and being coupled to either the row or column lines associated with said array.

4. The system according to claim 3, further including at least one level of decoders for decoding the bits in the most significant digit position in said address register, said level being coupled to either the row or column lines associated with said array.

* * * * *